(12) United States Patent
Mulvaney

(10) Patent No.: US 8,324,962 B2
(45) Date of Patent: Dec. 4, 2012

(54) APPARATUS AND METHOD FOR DEMODULATION

(75) Inventor: Kenneth Mulvaney, Cork (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 13/024,062

(22) Filed: Feb. 9, 2011

(65) Prior Publication Data

US 2012/0200348 A1    Aug. 9, 2012

(51) Int. Cl.
*H03D 3/00* (2006.01)
(52) U.S. Cl. .......... 329/302; 329/300; 375/334
(58) Field of Classification Search .......... 329/300–303; 375/334–337
See application file for complete search history.

(56) References Cited

U.S. PATENT DOCUMENTS

| 6,275,542 | B1 | 8/2001 | Katayama et al. |
| 7,352,831 | B2 | 4/2008 | Quinlan et al. |
| 7,397,300 | B2 | 7/2008 | Quinlan et al. |
| 2005/0089120 | A1 * | 4/2005 | Quinlan et al. ............ 375/335 |

* cited by examiner

*Primary Examiner* — Joseph Chang
(74) *Attorney, Agent, or Firm* — Knobbe Martens Olson & Bear LLP (57) ABSTRACT

Apparatus and methods for demodulation are provided. In one embodiment, a method includes receiving an input signal having a frequency that varies in relation to a state of the signal, calculating a sine and cosine of a phase control signal, generating a first signal proportional to the sine of a product of a first quantity and the frequency of the input signal, generating a second signal proportional to the cosine of a product of the first quantity and the frequency of the input signal, and summing a product of the first signal and the cosine of the phase control signal with a product of the second signal and the sine of the phase control signal to generate a demodulator output for resolving the state of the input signal. In certain implementations, the phase control signal is controlled so as to reduce a frequency error of the input signal.

39 Claims, 5 Drawing Sheets

FIG. 5

APPARATUS AND METHOD FOR DEMODULATION

BACKGROUND

1. Field

Embodiments of the invention relate to electronic devices, and more particularly, to demodulators.

2. Description of the Related Technology

Certain electronic systems, such as receiver or transceivers, can include a demodulator for demodulating electronic signals received from a transmitter. For example, the signal can be modulated and transmitted using frequency-shift keying (FSK), in which a bitstream is communicated by varying the frequency of the transmitted signal. For example, the data can be transmitted on a carrier signal, with positive and negative frequency deviations with respect to the carrier frequency representing the transmitted data.

An electronic system, such as a receiver or a transceiver, can include a demodulator for demodulating a received signal to determine the transmitted content. The electronic system can translate the received signal to an intermediate frequency using a local oscillator to aid in resolving the bitstream. However, a frequency mismatch between the local oscillator and the carrier frequency can cause bit errors in the demodulated bitstream. To accommodate a frequency mismatch, a demodulator can be tuned with excess bandwidth rather than optimally tuning the demodulator based on the modulation characteristics of the received signal. However, it can be important to minimize bandwidth of an electronic system.

There is a need for improved demodulators. Furthermore, there is a need for demodulators having improved resilience to frequency error in a received signal. Moreover, there is a need for demodulators that can be tuned based on the modulation characteristics of a received signal.

SUMMARY

In one embodiment, an apparatus includes a sine correlator having an input configured to receive an input signal, the input signal having a radian frequency that varies in relation to a state of the input signal. The sine correlator is configured to generate an output that is about proportional to a sine of a product of the radian frequency of the input signal and a delay time. The apparatus further includes a cosine correlator having an input configured to receive the input signal, the cosine correlator configured to generate an output that is about proportional to a cosine of the product of the radian frequency of the input signal and the delay time. The apparatus further includes a first mixer configured to multiply the output of the sine correlator and a first quantity corresponding to a cosine of a phase control signal to generate a first product, a second mixer configured to multiply the output of the cosine correlator and a second quantity corresponding to a sine of the phase control signal to generate a second product, and a first adder configured to sum the first and second products to generate a demodulator output. The demodulator output is proportional to about the sine of a product of the radian frequency of the input signal and the delay time shifted by a selectable phase shift, the phase shift selectable via control of the phase control signal.

In another embodiment, a method for demodulating an input signal includes receiving the input signal, the input signal having a radian frequency that varies in relation to a state of the input signal, generating a first signal that is about proportional to a sine of a product of the radian frequency of the input signal and a delay time, and generating a second signal that is about proportional to a cosine of the product of the radian frequency of the input signal and the delay time. The method further includes multiplying the first signal and a third signal to generate a first product, and multiplying the second signal and a fourth signal to generate a second product. The third signal at least approximately corresponds to a cosine of a phase control signal, and the fourth signal at least approximately corresponds to a sine of the phase control signal. The method further includes adding the first and second products to generate a demodulator output, the demodulator output proportional to about a sine of a product of the radian frequency of the input signal and the delay time shifted by a selectable phase shift, the selectable phase shift selectable via control of the phase control signal. Receiving, generating, multiplying and adding are performed in electronic hardware.

In another embodiment, an apparatus includes means for receiving an input signal having a radian frequency that varies in relation to a state of the input signal, means for generating a first signal that is about proportional to a sine of a product of the radian frequency of the input signal and a delay time, and means for generating a second signal that is about proportional to a cosine of the product of the radian frequency of the input signal and the delay time. The apparatus further includes means for multiplying the first signal and a third signal to generate a first product, and means for multiplying the second signal and a fourth signal to generate a second product. The third signal at least approximately corresponds to a cosine of a phase control signal, and the fourth signal at least approximately corresponds to a sine of the phase control signal. The apparatus further includes means for adding the first and second products to generate a demodulator output, the demodulator output proportional to about a sine of a product of the radian frequency of the input signal and the delay time shifted by a selectable phase shift, the phase shift selectable via control of the phase control signal.

In another embodiment, a method for demodulating an input signal includes receiving the input signal, the input signal having a frequency that varies in relation to a state of the input signal, the input signal including a first state corresponding to a first frequency equal to about an intermediate frequency plus a frequency deviation and a second state corresponding to a second frequency equal to about an intermediate frequency minus a frequency deviation. The method further includes calculating a sine of a phase control signal and a cosine of a phase control signal, and generating a first signal proportional to about a sine of a product of a first quantity and the frequency of the input signal and a second signal proportional to a cosine of the product of the first quantity and the frequency of the input signal. The method further includes summing a product of the first signal and the cosine of the phase control signal with a product of the second signal and the sine of the phase control signal to generate a demodulator output for resolving the state of the input signal, the demodulator output having a frequency response about proportional to a sine of a product of the first quantity and the frequency of the input signal shifted by a phase. The phase is selected using the phase control signal such that the demodulator has a first output value when the input frequency is equal to about the first frequency and a second output value when the input frequency is equal to about the second frequency, the first and second output values having normalized magnitudes equal to about one and opposite polarities.

DETAILED DESCRIPTION OF EMBODIMENTS

The following detailed description of certain embodiments presents various descriptions of specific embodiments of the invention. However, the invention can be embodied in a multitude of different ways as defined and covered by the claims. In this description, reference is made to the drawings where like reference numerals indicate identical or functionally similar elements.

Overview of Certain Electronic Systems Using a Demodulator

Figure 1:
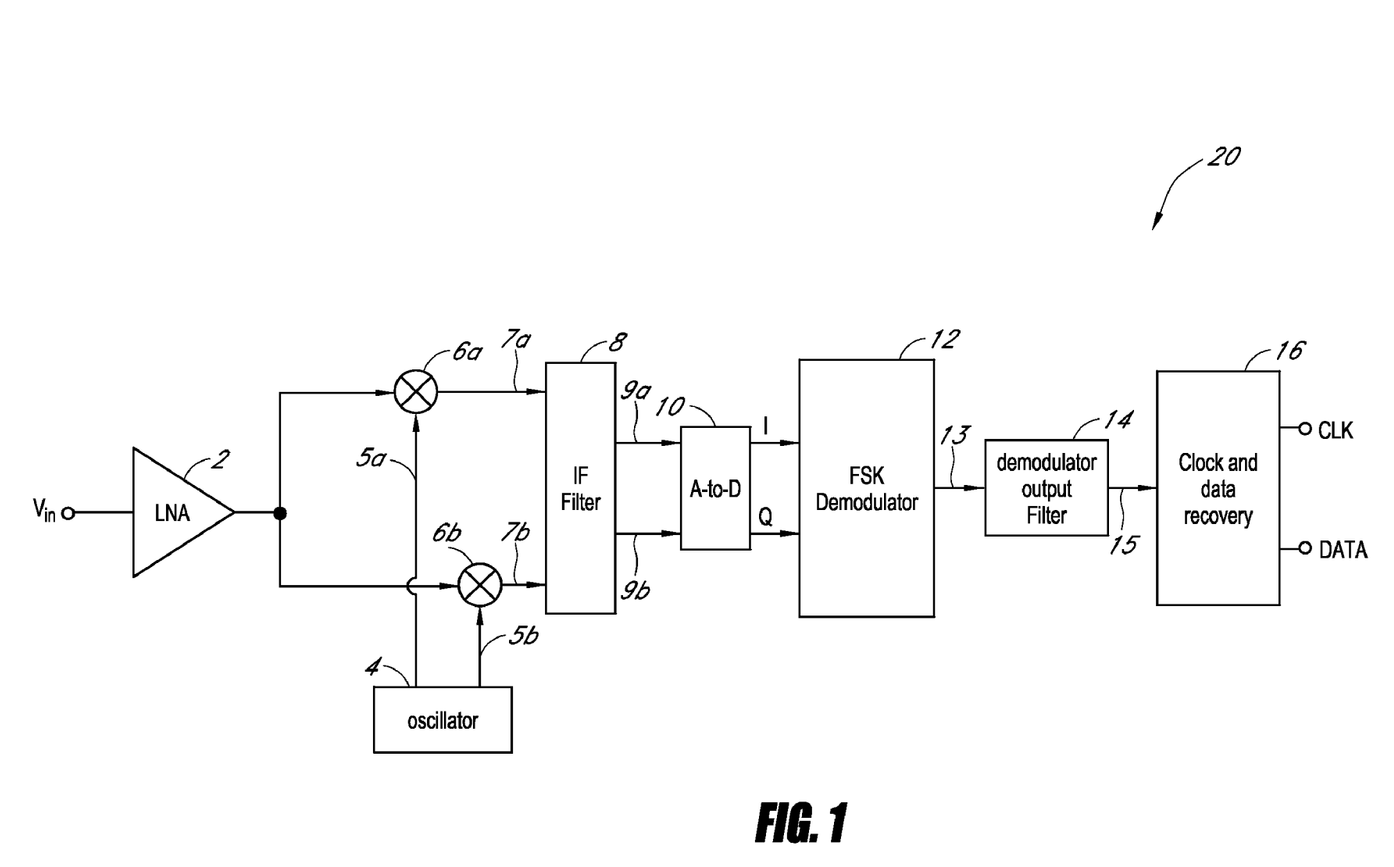
FIG. 1 is a schematic block diagram of an electronic system having a demodulator.

FIG. 1 is a schematic block diagram of an electronic system 20. The electronic system 20 includes a low noise amplifier 2, an oscillator 4, first and second mixers 6a, 6b, an intermediate frequency channel filter 8, an analog-to-digital converter 10, a demodulator 12, a demodulator output filter 14, and a clock and data recovery block 16. The electronic system 20 can be included in, for example, a receiver, a transmitter/receiver or a transceiver. The electronic system 20 can be used for demodulating signals received using a variety of communication standards, including, for example, IEEE 802.15.4, Global System for Mobile Communications (GSM), Bluetooth, ISA100.11a, and/or Wireless HART, as well as other proprietary and non-proprietary Gaussian frequency-shift keying (GFSK) and frequency-shift keying (FSK) based schemes, including multi-level FSK schemes, such as 4FSK. Additionally, in certain embodiments, the electronic system 20 can be used to demodulate signals based on other standards, including frequency modulation (FM), minimum shift keying (MSK), phase-shift keying (PSK), and offset quadrature phase-shift keying (OQPSK) modulated input signals. For example, to perform PSK demodulation, the demodulator output filter 14 can be configured to operate as an integrate and dump filter. The demodulator 12 can also be used in multi-level demodulation schemes, such as multiple frequency-shift keying (MFSK), in which multi-bit symbols are utilized.

The low noise amplifier 2 includes an input for receiving an input signal $V_{in}$, which can be a radio frequency (RF) signal received by the electronic system 20 over an antenna. For example, the electronic system 2 can receive a packet from a transmitter transmitting over the UHF, VHF, and/or ISM frequency bands at a distance of up to several kilometers, for example, up to about 20 km. Thus, the carrier frequency of the input signal Vin can be have a variety of values, including, but not limited to, a carrier frequency ranging between about 433 MHz to about 2.4 Ghz. The frequency deviation $f_{dev}$ representing the data on the input signal Vin can be, for example, in the range of about 100 Hz to about 5 Mhz. The frequency deviation $f_{dev}$ can correspond to a radian frequency deviation equal to about $2\pi * f_{dev}$.

The signal Vin can be received by the low noise amplifier 2, and can have a relatively small magnitude. The low noise amplifier 2 can be configured to amplify the signal, while adding a relatively small amount of noise. The low noise amplifier 2 can provide the amplified signal to first and second mixers 6a, 6b.

The first and second mixers 6a, 6b can be configured to receive first and second local oscillator clock signals 5a, 5b, respectively, from the oscillator block 4. The first and second oscillator clock signals 5a, 5b can have about the same frequency and a phase difference equal to about a quarter of a period, or about 90°. The first and second mixers 6a, 6b can be configured to multiply the amplified input signal from the low noise amplifier 2 by the first and second oscillator clock signals 5a, 5b, respectively, thereby generating first and second mixed signals 7a, 7b. In one embodiment, one of the first or second oscillator clock signals 5a, 5b is generated by phase shifting from the other.

The first and second local oscillator clock signals 5a, 5b can each have a frequency selected so as to achieve a desired intermediate frequency IF for the first and second mixed signals 7a, 7b. For example, multiplying the amplified input signal by a sinusoidal signal from the oscillator 4 can produce a mixed signal having a frequency content centered about the sum and difference frequencies of the carrier frequency of the amplified input signal and the frequency of the oscillator 4. The intermediate frequency channel filter 8 can be, for example, a band pass filter, and can be used to remove undesired frequency content from the first and second mixed signals, thereby generating first and second analog quadrature signals 9a, 9b, which are also down converted from the radio frequency. The first and second analog quadrature signals 9a, 9b can have frequency content centered about the intermediate frequency IF. In certain implementations, the intermediate frequency channel filter 8 can be provided after the analog-to-digital converter 10, and intermediate frequency channel filtering can be performed in whole or in part in the digital domain.

In one embodiment, the electronic system 2 uses an intermediate frequency IF of about 0 Hz, and the first and second local oscillator clock signals 5a, 5b can have a frequency equal to about that of the carrier frequency of the input signal $V_{in}$. Using an intermediate frequency of about 0 Hz can aid in increasing the blocking resilience and can improve frequency selectivity, which can aid in reducing interference when receiving a signal over a relatively noisy frequency band. However, the intermediate frequency can be other values, such as an intermediate frequency less than or equal to about 20 MHz. For example, the electronic system 20 can use a non-zero intermediate frequency ranging between about 100 kHz to about 10 MHz. In certain implementations, the first and second local oscillator clock signals 5a, 5b can contain spurious components, which can have a relatively large magnitude at certain frequencies. To aid in reducing the impact of the spurious components on the operation of the electronic system 20, the oscillator 4 can be configured to vary the intermediate frequency of the electronic system 20 when spurious components are detected in the first and second local oscillator clock signals 5a, 5b. The frequency error introduced by the clock variation can be corrected using the demodulation schemes described herein.

The first and second analog quadrature signals 9a, 9b can be provided to an analog-to-digital converter 10, which can digitize the first and second analog quadrature signals 9a, 9b to generate a digital in-phase signal I and a digital quadrature signal Q, respectively. The analog-to-digital converter 10 can have any suitable resolution. In one embodiment, the analog-to-digital converter 10 is a 1-bit analog-to-digital converter, such as a limiter or a saturated analog-to-digital converter, and the I and Q signals are one-bit digital signals. Although the electronic system 20 is illustrated as having the analog-to-digital converter 10, in certain embodiments, the analog-to-digital converter 10 can be omitted in favor of using analog in-phase and quadrature signals for demodulation. For example, the electronic system 10, including the FSK modulator 12, can be implemented in a full analog system.

The electronic system 20 includes the demodulator 12, which can receive and demodulate the I and Q signals to generate a demodulator output signal 13. Additional details of the demodulator 12 can be as described below with reference to FIGS. 2-5.

The demodulator 12 can provide the demodulator output signal 13 to the demodulator output filter 14, which can be, for example, a low pass filter. The demodulator output filter 14 can remove noise and harmonics from the demodulator output, and can have a bandwidth optimized for a variety of data rates. The filtered demodulator output 15 can be provided to a clock and data recovery block 16. In certain embodiments, the demodulator output filter 14 can be omitted.

The filtered demodulator output 15 can be a serial data stream having a relatively high data rate, and the clock and data recovery block 16 can be configured to recover a data signal DATA and a clock signal CLK from the filtered demodulator output 15. The clock and data recovery block 16 can include, for example, a sampler, a phase detector, a frequency detector, and a controlled oscillator. However, skilled artisans will appreciate that the clock and data recovery block 16 can utilize any suitable method to recover the clock signal CLK and data signal DATA from the filtered demodulator output 15. The clock and data recovery block 16 can provide the clock signal CLK and data signal DATA to another block, such as a processor for processing the demodulated data.

Overview of Demodulators

Demodulators are described herein having improved frequency response characteristics. The demodulator can have a frequency response proportional to a phase-shifted sinusoid of the product of the input frequency and a delay time. The phase of the sinusoidal frequency response can be controlled using a phase control signal. By using the phase control signal to vary the frequency response of the demodulator, the demodulator can be used in electronic systems having a wide range of intermediate frequency values, and thus, can enhance design flexibility. Furthermore, the phase control signal of the demodulator can be selectively controlled so as to reduce errors in the carrier frequency. The demodulator can include a controller for selected the phase of the frequency response characteristic, so as to tune the demodulator frequency response to improve robustness to frequency errors in the carrier frequency.

Figure 2:
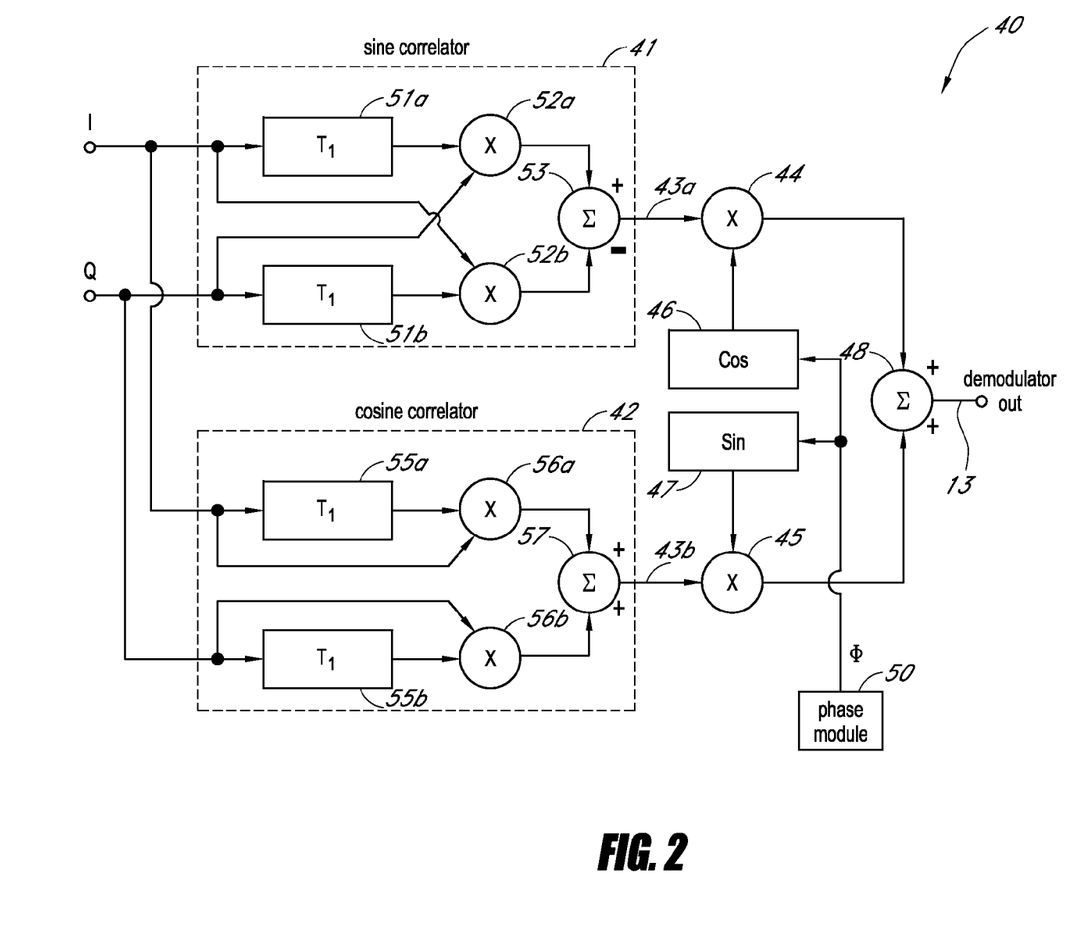
FIG. 2 is a schematic diagram of a demodulator in accordance with one embodiment.

FIG. 2 is a schematic diagram of a demodulator 40 in accordance with one embodiment. The demodulator 40 includes a sine correlator 41, a cosine correlator 42, first and second mixers 44, 45, a first adder 48, a phase module 50, a cosine module 46, and a sine module 47.

The sine correlator 41 includes first and second delay blocks 51a, 51b, third and fourth mixers 52a, 52b, and subtractor 53. The first delay block 51a has an input configured to receive the I signal, and an output electrically connected to a first input to the third mixer 52a. The third mixer 52a further includes a second input for receiving the Q signal, and an output electrically connected to a first input of the subtractor 53. The second delay block 51b has an input configured to receive the Q signal, and an output electrically connected to a first input of the fourth mixer 52b. The fourth mixer 52b further includes a second input for receiving the I signal, and an output electrically connected to a second input of the subtractor 53.

The first and second delay elements 51a, 51b can delay the I and Q signals, respectively, to generate delayed I and delayed Q signals. Each of the first and second delay elements 51a, 51b can have a delay of about $T_1$. The output of the first delay block 51a can be multiplied by the Q signal, and provided to the first input of the subtractor 53. Likewise, the output of the second delay block 51b can be multiplied by the I signal, and provided to the second input of the subtractor 53. The subtractor 53 can be configured to subtract the second input from the first input, so as to generate the sine correlator output signal 43a.

As persons of ordinary skill in the art will appreciate, the sine correlator 41 can have a frequency response proportional to about $\sin(2\pi f^* T_1)$, where f is the frequency of the I and Q signals, and $T_1$ is as described above. For example, the sine correlator 41 can have a frequency response equal to about $A^{2*} \sin(2\pi f^* T_1)$, where A is a constant.

The cosine correlator 42 includes third and fourth delay blocks 55a, 55b, fifth and sixth mixers 56a, 56b, and a second adder 57. The third delay block 55a has an input configured to receive the I signal, and an output electrically connected to a first input of the fifth mixer 56a. The fifth mixer 56a further includes a second input for receiving the I signal, and an output electrically connected to a first input of the second adder 57. The fourth delay block 55b has an input configured to receive the Q signal, and an output electrically connected to a first input of the sixth mixer 56b. The sixth mixer 56b further includes a second input for receiving the Q signal, and an output electrically connected to a second input of the second adder 57.

The third and fourth delay elements 55a, 55b can delay the I and Q signals, respectively, to generate delayed I and Q signals. Each of the third and fourth delay elements 55a, 55b can have a delay of about $T_1$. The output of the third delay block 55a can be multiplied by the I signal, and provided to the first input of the adder 57. Likewise, the output of the fourth delay block 55b can be multiplied by the Q signal, and provided to the second input of the second adder 57. The adder 57 can add the first and second inputs to generate the cosine correlator output signal 43b. Although the cosine correlator 42 is shown as having third and fourth delay elements 55a, 55b, in certain embodiments the third and fourth delay elements 55a, 55b can be omitted in favor of using the first and second delay elements 51a, 51b to generate the delayed I and Q signals for the both the sine correlator 41 and the cosine correlator 42.

As persons of ordinary skill in the art will appreciate, the cosine correlator 42 can have a frequency response proportional to about $\cos(2\pi f^* T_1)$, where f is the frequency of the I and Q signals, and $T_1$ is as described above. For example, the sine correlator 41 can have a frequency response equal to about $A^{2*} \cos(2\pi f^* T_1)$, where A is a constant.

For FSK demodulation using an intermediate frequency equal to about IF, the I and Q signals can each have a frequency of about IF $+/-f_{dev}$, where $f_{dev}$ is the frequency deviation of the received signal relative to the carrier frequency and IF is the intermediate frequency. In certain embodiments, the delay $T_1$ is selected to be equal to about $1/(4f_{dev})$. However, the delay $T_1$ can be selected to be other values, including a value less than about $1/(4f_{dev})$ so as to tune the demodulator with excess bandwidth.

For a conventional demodulator using either the sine correlator output signal 43a or the cosine correlator output signal 43b to generate the demodulator output, the demodulator can have a frequency deviation $f_{dev}$ that is constrained relative to the intermediate frequency IF. For example, it can be desirable for the demodulator to have an output of about zero for a frequency equal to about the intermediate frequency. Additionally, it can be desirable for the demodulator to have relatively large outputs of opposite polarity for a first frequency equal to about the intermediate frequency plus the frequency deviation and for a second frequency equal to about the intermediate frequency minus the frequency deviation. For example, the output of the demodulator can have a relatively large positive output representing a positive frequency deviation and a relatively large negative output representing a negative frequency deviation, or a relatively large negative output representing a positive frequency deviation and a relatively large positive output representing a negative frequency deviation.

To accommodate these conditions, the conventional demodulator using a cosine or sine correlator can have an intermediate frequency IF that is constrained relative to the frequency deviation to be equal to about $f_{dev}*k$, where k is an integer greater than or equal to zero. For example, when the intermediate frequency IF is selected to be equal to about $f_{dev}*k$ and the delay $T_1$ is selected to be equal to about $1/(4f_{dev})$, a sine correlator can have a frequency response equal to about $A^2 * \sin(\pi/2*(k+1))$ when the I and Q signals have a frequency equal to about $IF+f_{dev}$, and a frequency response equal to about $A^2 * \sin(\pi/2*(k-1))$ when the I and Q signals have a frequency equal to about $IF-f_{dev}$. Thus, to obtain about outputs equal to about $A^2$ and $-A^2$ for frequency inputs of $IF+f_{dev}$ and $IF-f_{dev}$, respectively, k can be limited to be an even integer. Similarly, a conventional modulator using a cosine correlator can have an intermediate frequency IF constrained to be equal to about the intermediate frequency IF multiplied by the product of an odd integer and the frequency deviation $f_{dev}$. As will be described below, the inclusion of the phase module 50, the cosine module 46, the sine module 47 and the adder 48 can be used to remove a constraint of the demodulator 40 that the intermediate frequency IF be equal to about an integer multiple of the frequency deviation $f_{dev}$.

With continuing reference to FIG. 2, the phase module 50 can be used to generate a phase control signal Φ, and to provide the phase control signal Φ to the cosine and sine modules 46, 47, which can be implemented by a look-up table, a digital signal processor (DSP), or the like. The cosine module 46 can receive the phase control signal Φ and can generate an output equal to about the cosine of the phase control signal Φ. Similarly, the sine module 47 can receive the phase control signal Φ and can generate an output equal to about the sine of the phase control signal Φ. The first mixer 44 can multiply the output of the sine correlator 41 and the cosine module 46, and the second mixer 45 can multiply the output of the cosine correlator 42 and the sine module 47. The first adder 43 can be configured to sum the results of the first and second mixers 44, 45 to generate the demodulator output 13. The demodulator output 13 can have a frequency response proportional to about $\cos(2\pi f*T_1)*\sin(\Phi)+\sin(2\pi f*T_1)*\cos(\Phi)$, which can be rearranged using trigonometric identities to equal $\sin(2\pi f*T_1+\Phi)$.

The demodulator 40 has a frequency response that can be tuned using the phase control signal Φ and the delay $T_1$ of the delay elements of the sine and cosine correlators 41, 42. For example, $T_1$ can be selected to be equal to about $1/(4f_{dev})$, where $f_{dev}$ is defined as above. Additionally, the phase control signal Φ can be selected such that the demodulator 40 has an output of about zero at the intermediate frequency. By using the phase control signal Φ to tune the frequency response of the demodulator 40, the constraint that the intermediate frequency IF be equal to about $f_{dev}*k$ can be removed. By configuring the phase module 50 to generate the phase control signal Φ, the frequency response of the demodulator 40 can be selected depending on the characteristics of the received signal, and the intermediate frequency need not restrict the tuning of the demodulator 40.

Figure 3:
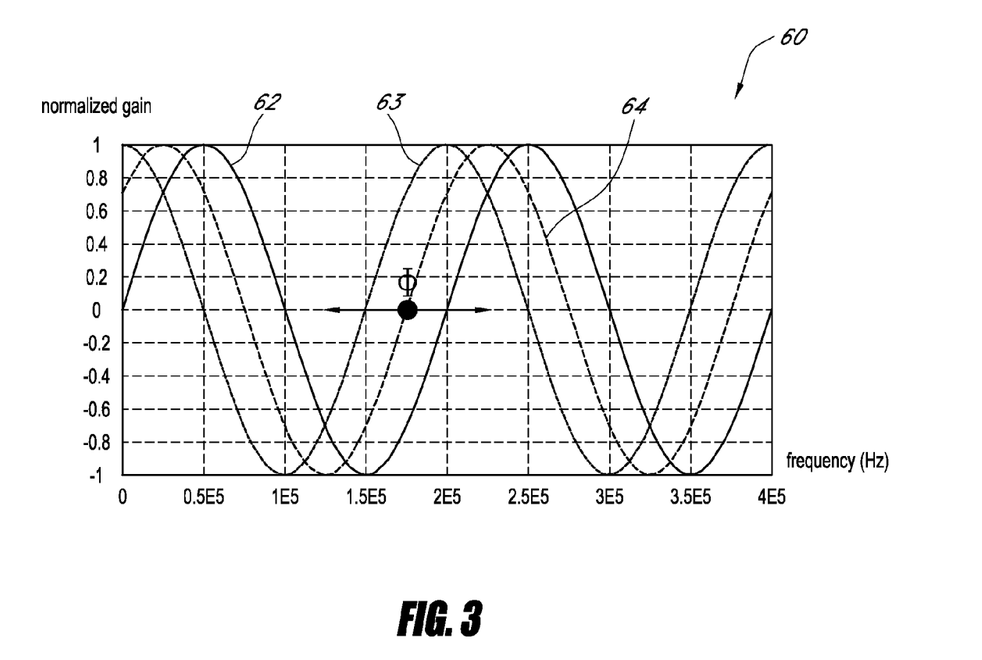
FIG. 3 is a frequency response plot of one example of the sine correlator, cosine correlator and demodulator of FIG. 2.

FIG. 3 is a frequency response graph 60 of one example of the sine correlator 41, the cosine correlator 42, and the demodulator 40 of FIG. 2. The graph 60 includes a first plot 62, a second plot 63, and a third plot 64, which correspond to the frequency response plots, or normalized gain as a function of frequency, of the sine correlator 41, the cosine correlator 42, and the demodulator 40, respectively. The first, second and third plots 62-64 are illustrated for the case of a frequency deviation $f_{dev}$ equal to about 50 kHz, and a delay $T_1$ of about 5 μs.

As shown in FIG. 3, the first plot 62 can have a frequency response that is proportional to about the sine of a product of the delay $T_1$ and the radian frequency of the in-phase signal I and quadrature signal Q. Likewise, the second plot 63 can have a frequency response that is proportional to about the cosine of a product of the delay $T_1$ and the radian frequency of the in-phase signal I and the quadrature signal Q. A conventional demodulator using the sine or cosine correlators as a demodulator output can have a constraint between the frequency deviation $f_{dev}$ and the intermediate frequency IF. For example, a system using the sine correlator and having a frequency response similar to that of the first plot 62 may use an intermediate frequency equal to about 100 kHz and a frequency deviation of about 50 kHz. This arrangement permits the system to have an output of about 0 for a frequency equal to about that of the intermediate frequency IF, and maximum outputs of opposite polarity for positive and negative frequency deviations from the intermediate frequency. A conventional demodulator using a sine or cosine correlator as a demodulator output can have an intermediate frequency IF constrained to be an integer multiple of the frequency deviation, or $f_{dev}*k$.

With continuing reference to FIG. 3, the third plot 64 corresponds to the output of one example of the demodulator 40 of FIG. 2. As shown in the third plot 64, the demodulator 40 can have a frequency response which can be tuned using the phase control signal Φ. For example, the third plot 64 is illustrated for a case in which the phase control signal Φ has a value equal to about π/4. As skilled artisans will appreciate, the phase control signal Φ can be selected such that the frequency response output of the demodulator is equal to about zero at the intermediate frequency IF. Thus, the demodulator 40 can have a delay $T_1$ selected to be equal to about $1/(4f_{dev})$, and thereafter the phase control signal Φ can be selected such that the demodulator has an output of about 0 for a frequency equal to about the intermediate frequency. Thus, the frequency response of the demodulator 40 can be selected depending on the characteristics of the received signal, and the intermediate frequency need not be a restriction in tuning the demodulator 40.

Figure 4:
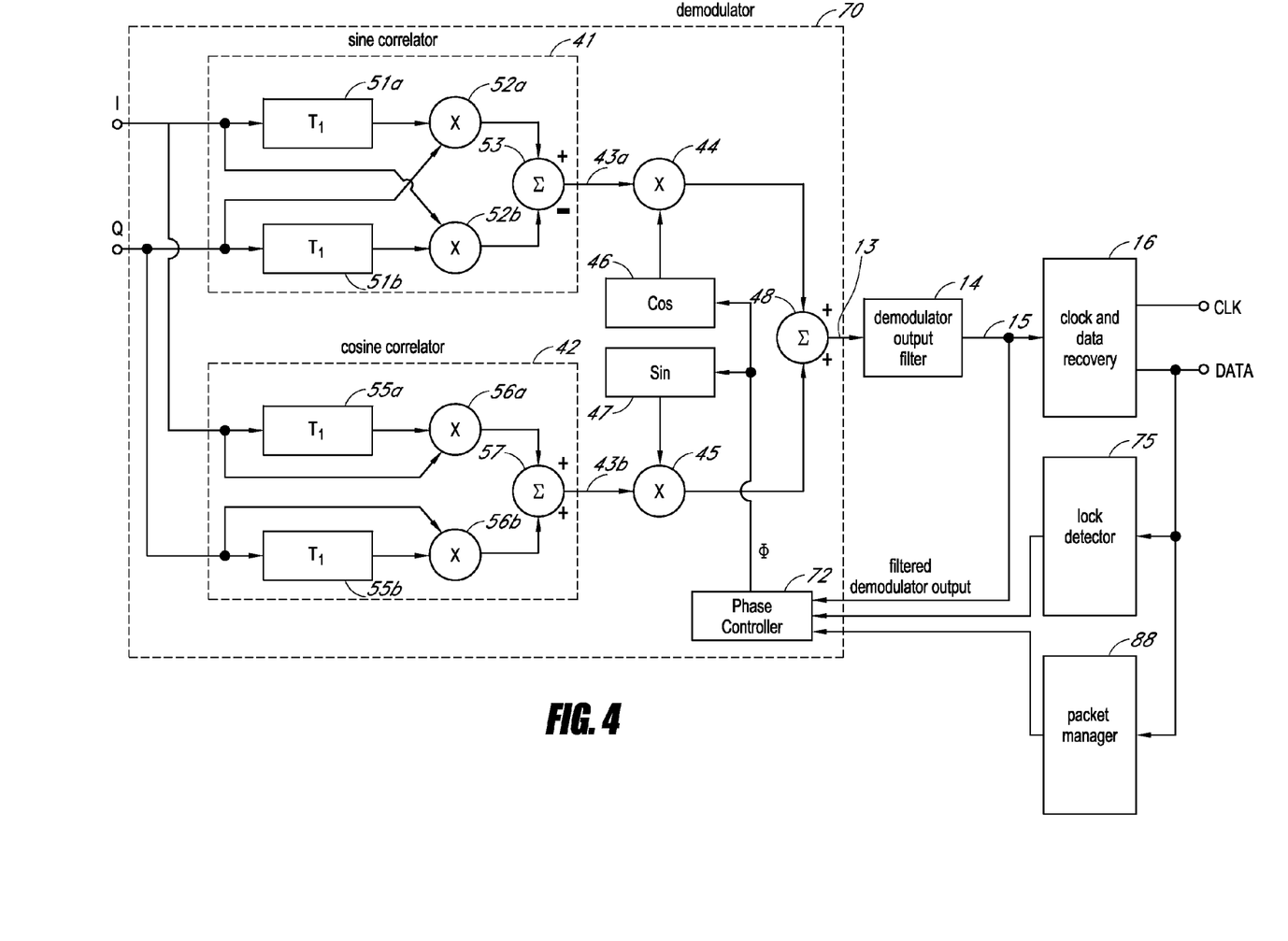
FIG. 4 is a schematic diagram of a clock and data recovery block, a demodulator output filter, a lock detector, a packet manager and a demodulator in accordance with another embodiment.

FIG. 4 is a schematic diagram of a clock and data recovery block 16, a demodulator output filter 14, a lock detector 75, a packet manager 88 and a demodulator 70 in accordance with another embodiment. The illustrated demodulator 70 includes a sine correlator 41, a cosine correlator 42, first and second mixers 44, 45, cosine module 46, sine module 47, and phase controller 72. The demodulator 70 can be similar to the demodulator 40 of FIG. 2. However, as shown in FIG. 4, the demodulator 70 includes the phase controller 72 for providing the phase control signal Φ. The demodulator 70 can be configured to generate the demodulator output signal 13, which can be provided to the demodulator output filter 14. As was described above with reference to FIG. 1, the demodulator output filter 14 can filter the demodulator output 13 to generate the filtered demodulator output 15. The filtered demodulator output 15 can be provided to the phase controller 72 and to the clock and data recovery block 16.

The phase controller 72 is electrically connected in a feedback configuration, and includes an input for receiving the filtered demodulator output 15 and an output for generating the phase control signal Φ. The phase controller 72 can control the phase control signal Φ so that the demodulator output 13 has a value equal to about zero at the intermediate frequency of the demodulator 70. The phase controller 72 can aid in dynamically adjusting the frequency response of the demodulator 70 to account for the presence of frequency errors in the received signal. For example, the phase control signal Φ can be selected to be equal to about $2\pi f_{err} * T_1$, where $T_1$ is the delay of the delays elements 51a-51b, 55a-55b of the sine and cosine correlators 41, 42, and $f_{err}$ is the frequency error of the received RF signal relative to the first and second oscillator clock signals 5a, 5b. The phase controller 72 can detect the frequency error $f_{err}$ by monitoring, for example, the value of the filtered demodulator output 15, which can have a DC content which is proportional to about the frequency error.

The phase controller 72 can dynamically adjust the frequency response of the demodulator 70 to account for the presence of frequency errors in the received signal. When an electronic system is configured to detect relatively large frequency errors, such as when an intermediate frequency channel filter has been configured to provide excess bandwidth, the illustrated phase controller 72 may lock about 180° out-of-phase. To avoid locking about 180° out-of-phase when the electronic system is tuned to correct for relatively large frequency errors in the carrier frequency, such as frequency errors greater than or equal to about $f_{dev}$, the lock detector 75 can be included to detect an out-of-phase lock condition. The lock detector 75 can monitor the output of the clock and data recovery block 16, including during periods in which a sequence of a known value is being demodulated, such as the start of a packet. The lock detector 75 can generate a lock signal indicating whether the demodulator system has locked in-phase or out-of-phase.

The lock signal can be provided to the phase controller 72, which can use the lock signal as an indicator to adjust the phase control signal Φ by about π radians. For example, the phase controller 72 can be configured to increment or decrement the phase control signal Φ by about π radians when the lock signal indicates that the demodulator is out-of-lock. However, the lock signal can be used for a variety of other purposes. In one implementation, the lock signal is used to invert the data outputted by the clock and data recover block 16 in any suitable way, such as by switching the in-phase signal I and quadrature signal Q provided to the demodulator 70 or by inverting the output using suitable circuit logic. The lock signal can also be used to set a status flag indicating that the data is inverted to aid in downstream processing of the data.

The packet manager 88 can be used to control the phase controller 72 of the demodulator 70. The packet manager 88 can be configured to analyze the sequence of bits received, and to determine the start of a packet. For example, a start of a packet can be indicated by a sequence of alternating ones and zeros. Since a packet header can have a known sequence of bits corresponding to a known DC content level, the packet manager 88 can be used to selectively enable the phase controller 72 so as to enhance the accuracy of the measured frequency error. Additional details of the packet manager 88 can be as described below with reference to FIG. 5.

Figure 5:
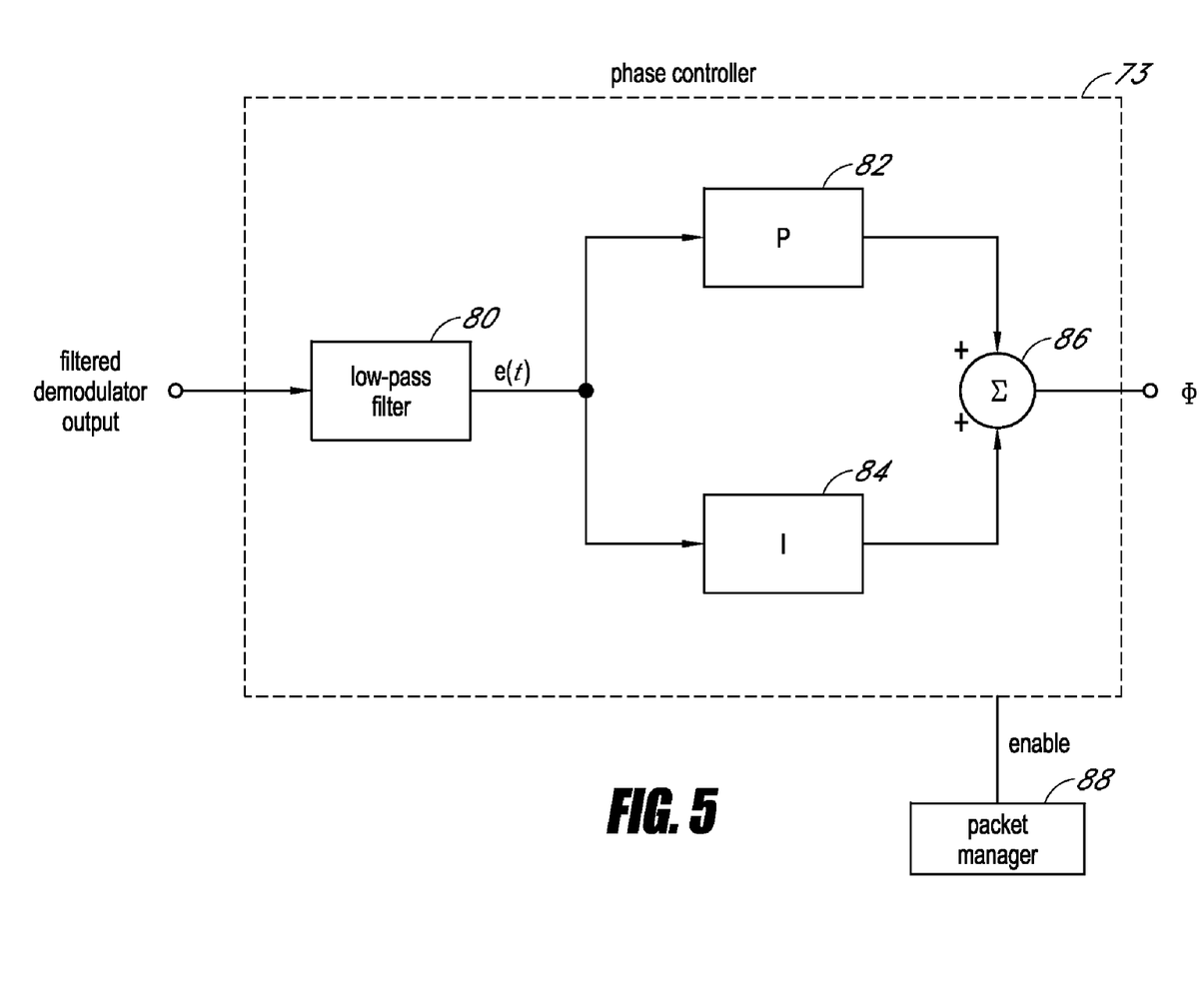
FIG. 5 is a schematic diagram of a phase controller for use in the demodulator of FIG. 4.

FIG. 5 is a schematic diagram of a PI phase controller 73 for use in the demodulator 70 of FIG. 4. The PI phase controller 73 includes a low pass filter 80, a P block 82, a I block 84 and an adder 86. The low-pass filter 80 can filter the filtered demodulator output 15 to generate the error signal e(t). The error signal e(t) can be proportional to about the DC content of the output of the demodulator, and can be provided to the P block 82 and to the I block 84. In certain implementations, the low pass filter 80 can have a bandwidth less than or equal to about half the data rate of the received signal.

The P block 82 can be configured to generate an output proportional to the error signal e(t). For example, the P block 82 can generate an output having a value equal to about $C_1 * e(t)$, where $C_1$ is a constant. The I block 84 can be configured to generate an output proportional to the integral of the error signal e(t) over a window of time. For example, the I block 84 can have an output equal to about $C_2 \int e(\tau) d\tau$, where $C_2$ is a constant and the integral is performed over any suitable window of time, such as, for example, a time greater than or equal to about twice the data rate of the receiving signal. The value of $C_1$, $C_2$ and the window of time for integration can be selected based on a variety of factors, such as on the characteristics of the frequency response of the demodulator 70. Skilled artisans will recognize that the integration performed in the I block 84 can be approximated using a variety of techniques. The outputs of the P block 82 and I block 84 can be summed using the adder 86 to generate the phase control signal Φ.

In one embodiment, a packet manager 88 is used to control the PI phase controller 73. The packet manager 88 can be configured to analyze the sequence of bits received, and to determine the start of a packet. For example, a start of a packet can be indicated by a sequence of alternating ones and zeros. Since a packet header can have a known sequence of bits corresponding to a known DC content level, such as a DC content of about zero, the PI phase controller 73 can be configured to permit a state of the phase control signal Φ to change when the packet header is detected, and to otherwise not change the state of the phase control signal Φ. This approach permits the PI phase controller 73 to be operative during a window of time when the DC content is of a known value, and thus can enhance the accuracy of the frequency measurement. The PI phase controller 73 can be enabled while receiving the packet header of each packet, or periodically every n packets, where n is an integer greater than one, to conserve power when demodulating a plurality of packets received from a transmitter. Other power savings schemes can be used. However, the packet manager 88 need not be included, and the PI phase controller 73 can be operated continuously during demodulation.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Applications

Devices employing the above described schemes can be implemented into various electronic devices. Examples of the electronic devices can include, but are not limited to, consumer electronic products, parts of the consumer electronic products, electronic test equipment, etc. Examples of the electronic devices can also include memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, a global positioning system (GPS) device, a remote control device, a wireless network terminal, etc. Further, the electronic device can include unfinished products.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus, comprising:
    a sine correlator having an input configured to receive an input signal, the input signal having a radian frequency that varies in relation to a state of the input signal, wherein the sine correlator is configured to generate an output that is about proportional to a sine of a product of the radian frequency of the input signal and a delay time;
    a cosine correlator having an input configured to receive the input signal, wherein the cosine correlator is configured to generate an output that is about proportional to a cosine of the product of the radian frequency of the input signal and the delay time;
    a first mixer configured to multiply the output of the sine correlator and a first quantity corresponding to a cosine of a phase control signal to generate a first product;
    a second mixer configured to multiply the output of the cosine correlator and a second quantity corresponding to a sine of the phase control signal to generate a second product; and
    a first adder configured to sum the first and second products to generate a demodulator output, the demodulator output proportional to about the sine of a product of the radian frequency of the input signal and the delay time shifted by a selectable phase shift, the phase shift selectable via control of the phase control signal.

2. The apparatus of claim 1, further comprising a cosine module configured to receive the phase control signal and to generate the first quantity, and a sine module configured to receive the phase control signal and to generate the second quantity.

3. The apparatus of claim 1, wherein the input signal includes an in-phase signal component and a quadrature signal component, the in-phase and quadrature signals each having a radian frequency equal to about the radian frequency of the input signal, and the in-phase and quadrature signals having a phase difference equal to about a quarter of a period of the in-phase and quadrature signals.

4. The apparatus of claim 3, further comprising a first delay element for generating a delayed in-phase signal and a second delay element for generating a delayed quadrature signal, the first delay element having a delay equal to about the delay time, wherein the sine correlator comprises a third mixer, a fourth mixer, and a subtractor, the third mixer configured to multiply the quadrature signal and the delayed in-phase signal to generate a third product, the fourth mixer configured to multiply the in-phase signal and the delayed quadrature signal to generate a fourth product, and the subtractor configured to subtract the fourth product from the third product to generate the output of the sine correlator, and wherein the cosine correlator comprises a fifth mixer, a sixth mixer, and a second adder, the fifth mixer configured to multiply the in-phase signal and the delayed in-phase signal to generate a fifth product, the sixth mixer configured to multiply the quadrature signal and the delayed quadrature signal to generate a sixth product, and the second adder configured to add the fifth and sixth products to generate the output of the cosine correlator.

5. The apparatus of claim 3, wherein the in-phase and quadrature signals are digital signals.

6. The apparatus of claim 5, wherein the apparatus is further configured to receive a radio frequency signal, the apparatus further comprising a third mixer, a fourth mixer, an oscillator block, an intermediate frequency channel filter, and an analog-to-digital converter, the oscillator block configured to generate a first oscillator clock signal and a second oscillator clock signal each having about the same frequency, the first oscillator clock signal and the second oscillator clock signal having a phase difference equal to about ninety degrees, wherein the third and fourth mixers are configured to multiply the radio frequency signal by first and second oscillator clock signals to generate first and second mixed signals, respectively, and wherein the intermediate frequency channel filter is configured to filter the first and second mixed signals to generate first and second filtered mixed signals, and wherein the analog-to-digital converter is configured to receive first and second filtered mixed signals and to quantize the filtered mixed signals to generate in-phase and quadrature signals, respectively.

7. The apparatus of claim 6, wherein a resolution of the analog-to-digital converter is about one bit.

8. The apparatus of claim 6, wherein the input signal is a frequency modulation (FM) signal.

9. The apparatus of claim 6, wherein the input signal includes a first state and a second state, the first state corresponding to a frequency equal to about an intermediate frequency plus a frequency deviation, and the second state corresponding to a frequency equal to about the intermediate frequency minus the frequency deviation, and wherein the radio frequency signal has a first state and a second state, the first state corresponding to a frequency equal to about a carrier frequency plus the frequency deviation, and the second state corresponding to a frequency equal to about the carrier frequency minus the frequency deviation.

10. The apparatus of claim 9, further comprising a phase module for generating the phase control signal, wherein the frequency of the first and second oscillator clock signals is offset from the intermediate frequency so as to avoid spurious components in the first and second oscillator clock signals, and wherein the phase controller is configured to adjust the phase control signal so as to tune the demodulator output in response to the frequency offset of the first and second oscillator clock signals.

11. The apparatus of claim 9, wherein the delay time is less than or equal to about one divided by four times the frequency deviation.

12. The apparatus of claim 9, wherein the first and second oscillator clock signals have a frequency equal to about the carrier frequency such the such that the intermediate frequency is equal to about 0 Hz.

13. The apparatus of claim 9, wherein the frequency of the first and second oscillator clock signals is selected such that the intermediate frequency is less than or equal to about 20 MHz.

14. The apparatus of claim 9, further comprising a phase module for generating the phase control signal, wherein the phase generator block is configured to generate the phase control signal such that the demodulator output has a magnitude equal to about zero at a frequency equal to about the intermediate frequency.

15. The apparatus of claim 9, further comprising a demodulator output filter for filtering the output of the first adder to generate a filtered demodulator output.

16. The apparatus of claim 15, further comprising a phase controller having in input configured to receive the filtered demodulator output and for generating the phase control signal, wherein the phase controller is configured to control the phase control signal so as to tune the demodulator output in response to a frequency error in the carrier frequency.

17. The apparatus of claim 16, wherein the controller comprises a filter, a P block, an I block, and a third adder, wherein the filter is configured to filter the filtered demodulator output of the first adder and to generate an error signal, the error signal proportional to a DC content of the filtered demodulator output, and wherein the P block is configured to receive the error signal and to scale the error signal to generate a scaled error signal, and wherein the I block is configured to integrate the error signal to generate an integrated error signal, and wherein the third adder is configured to add the scaled error signal and the integrated error signal to generate the phase control signal.

18. The apparatus of claim 17, further comprising a packet manager for analyzing the input signal so as to determine a packet header of the input signal, and wherein the packet manager is configured to permit the phase control signal to change value when the packet header is detected and to otherwise prevent the phase control signal from changing value.

19. The apparatus of claim 17, wherein the phase controller is configured to detect an out-of-phase lock condition and to adjust the magnitude of the phase control signal by about $\pi$ radians when an out-of-phase lock condition is detected.

20. A method for demodulating an input signal, the method comprising:
receiving the input signal, the input signal having a radian frequency that varies in relation to a state of the input signal;
generating a first signal that is about proportional to a sine of a product of the radian frequency of the input signal and a delay time;
generating a second signal that is about proportional to a cosine of the product of the radian frequency of the input signal and the delay time;
multiplying the first signal and a third signal to generate a first product, wherein the third signal at least approximately corresponds to a cosine of a phase control signal;
multiplying the second signal and a fourth signal to generate a second product, wherein the fourth signal at least approximately corresponds to a sine of the phase control signal; and
adding the first and second products to generate a demodulator output, the demodulator output proportional to about a sine of a product of the radian frequency of the input signal and the delay time shifted by a selectable phase shift, the selectable phase shift selectable via control of the phase control signal, and
wherein receiving, generating, multiplying and adding are performed in electronic hardware.

21. The method of claim 20, further comprising generating the third signal and generating the fourth signal.

22. The method of claim 20, wherein the input signal includes an in-phase signal component and a quadrature signal component, the in-phase and quadrature signals each having a radian frequency equal to about the radian frequency of the input signal, and the in-phase and quadrature signals having a phase difference equal to about a quarter of a period of the in-phase and quadrature signals.

23. The method of claim 20, further comprising:
receiving a radio frequency signal, the radio frequency signal having a frequency content centered about a carrier frequency;
generating first and second local oscillator clock signals, the first and second oscillator clock signals having a frequency that is about equal and a phase difference equal to about a quarter of the period of the first and second oscillator clock signals;
multiplying the radio frequency signal by first and second local oscillator clock signals to generate first and second mixed signals, respectively;
filtering the first mixed signal to generate the in-phase signal; and
filtering the second mixed signal to generate the quadrature signal, the in-phase and quadrature signals having a frequency content centered about an intermediate frequency.

24. The method of claim 23, further comprising selecting the phase control signal such that the demodulator output has a magnitude equal to about zero at a frequency equal to about the intermediate frequency.

25. The method of claim 20, further comprising filtering the demodulator output to generate a filtered demodulator output.

26. The method of claim 20, further controlling the phase control signal to reduce a frequency error of the input signal.

27. The method of claim 26, wherein controlling the phase control signal comprises:
filtering the filtered demodulator output to generate an error signal;
scaling the error signal to generate a scaled error signal;
integrating the error signal to generate an integrated error signal; and
adding the scaled error signal and integrated error signal to generate the phase control signal.

28. The method of claim 26, further comprising analyzing the input signal to determine a presence of a packet header and changing the phase control signal when the packet header is detected, and otherwise not changing the phase control signal.

29. The method of claim 26, wherein controlling the phase control signal comprises detecting an out-of-phase lock condition and adjusting the magnitude of the phase control signal by about $\pi$ radians when an out-of-phase lock condition is detected.

30. An apparatus comprising:
means for receiving an input signal having a radian frequency that varies in relation to a state of the input signal;
means for generating a first signal that is about proportional to a sine of a product of the radian frequency of the input signal and a delay time;

means for generating a second signal that is about proportional to a cosine of the product of the radian frequency of the input signal and the delay time;

means for multiplying the first signal and a third signal to generate a first product, wherein the third signal at least approximately corresponds to a cosine of a phase control signal;

means for multiplying the second signal and a fourth signal to generate a second product, wherein the fourth signal at least approximately corresponds to a sine of the phase control signal; and means for adding the first and second products to generate a demodulator output, the demodulator output proportional to about a sine of a product of the radian frequency of the input signal and the delay time shifted by a selectable phase shift, the phase shift selectable via control of the phase control signal.

31. The apparatus of claim 30, further comprising means for generating the third signal and means for generating the fourth signal.

32. The apparatus of claim 30, wherein the input signal includes an in-phase signal component and a quadrature signal component, the in-phase and quadrature signals each having a radian frequency equal to about the radian frequency of the input signal, and the in-phase and quadrature signals having a phase difference equal to about a quarter of a period of the in-phase and quadrature signals.

33. The apparatus of claim 30, further comprising:
means for receiving a radio frequency signal, the radio frequency signal having a frequency content centered about a carrier frequency;
means for generating first and second local oscillator clock signals, the first and second oscillator clock signals having a frequency that is about equal and a phase difference equal to about a quarter of the period of the first and second oscillator clock signals;
means for multiplying the radio frequency signal by first and second local oscillator clock signals to generate first and second mixed signals, respectively;
means for filtering the first mixed signal to generate the in-phase signal; and
means for filtering the second mixed signal to generate the quadrature signal, the in-phase and quadrature signals having a frequency content centered about an intermediate frequency.

34. The apparatus of claim 30, further comprising means for controlling the phase control signal such that the demodulator output has a magnitude equal to about zero at a frequency equal to about the intermediate frequency.

35. A method for demodulating an input signal, the method comprising:
receiving the input signal, the input signal having a frequency that varies in relation to a state of the input signal, the input signal including a first state corresponding to a first frequency equal to about an intermediate frequency plus a frequency deviation and a second state corresponding to a second frequency equal to about an intermediate frequency minus a frequency deviation;
calculating a sine of a phase control signal and a cosine of a phase control signal;
generating a first signal proportional to about a sine of a product of a first quantity and the frequency of the input signal, and a second signal proportional to a cosine of the product of the first quantity and the frequency of the input signal;
summing a product of the first signal and the cosine of the phase control signal with a product of the second signal and the sine of the phase control signal to generate a demodulator output for resolving the state of the input signal, the demodulator output having a frequency response about proportional to a sine of a product of the first quantity and the frequency of the input signal shifted by a phase, wherein the phase is selected using the phase control signal such that the demodulator has a first output value when the input frequency is equal to about the first frequency and a second output value when the input frequency is equal to about the second frequency, the first and second output values having normalized magnitudes equal to about one and opposite polarities.

36. The method of claim 35, further comprising filtering the demodulator output to generate a filtered demodulator output.

37. The method of claim 36, further controlling the phase control signal to reduce a frequency error of the input signal.

38. The method of claim 37, wherein controlling the phase control signal comprises:
filtering the filtered demodulator output to generate an error signal;
scaling the error signal to generate a scaled error signal;
integrating the error signal to generate an integrated error signal; and
adding the scaled error signal and integrated error signal to generate the phase control signal.

39. The method of claim 38, further comprising analyzing the input signal to determine a presence of a packet header and changing the phase control signal when the packet header is detected, and otherwise not changing the phase control signal.

* * * * *